United States Patent

Hübner

[11] Patent Number: 5,943,563
[45] Date of Patent: Aug. 24, 1999

[54] METHOD FOR PRODUCING A THREE-DIMENSIONAL CIRCUIT ARRANGEMENT

[75] Inventor: Holger Hübner, Baldham, Germany

[73] Assignee: Siemens Aktiengesellschaft, Munich, Germany

[21] Appl. No.: 08/776,557

[22] PCT Filed: Aug. 1, 1995

[86] PCT No.: PCT/DE95/00998

§ 371 Date: Jan. 30, 1997

§ 102(e) Date: Jan. 30, 1997

[87] PCT Pub. No.: WO96/04683

PCT Pub. Date: Feb. 15, 1996

[30] Foreign Application Priority Data

Aug. 3, 1994 [DE] Germany .............................. 44 27 515

[51] Int. Cl.⁶ .................................................. H01L 21/00
[52] U.S. Cl. ............................ 438/155; 438/455; 438/458
[58] Field of Search .................................... 438/118, 155, 438/406, 455, 458

[56] References Cited

U.S. PATENT DOCUMENTS

| | | |
|---|---|---|
| 4,142,893 | 3/1979 | Adlerstein et al. . |
| 4,237,600 | 12/1980 | Rosen et al. .............................. 438/155 |
| 4,983,251 | 1/1991 | Haisma et al. ............................... 438/3 |
| 5,087,585 | 2/1992 | Hayashi .................................... 438/155 |
| 5,250,843 | 10/1993 | Eichelberger . |
| 5,391,257 | 2/1995 | Sullivan et al. .......................... 438/458 |
| 5,453,394 | 9/1995 | Yonehara et al. ........................ 438/455 |

FOREIGN PATENT DOCUMENTS

| | | |
|---|---|---|
| 0531723 A1 | 3/1993 | European Pat. Off. . |
| 2489041 | 2/1982 | France . |
| 43 08 705 A1 | 9/1993 | Germany . |

OTHER PUBLICATIONS

Japanese Journal of Applied Physics, vol. 23, No. 10, Oct. 1984, Tokyo, T. Hamaguchi et al., Device Layer Transfer Technique Using Chemi–Mechanical Polishing, pp. L815–L817.

*Primary Examiner*—John F. Niebling
*Assistant Examiner*—Christopher Lattin
*Attorney, Agent, or Firm*—Hill & Simpson

[57] ABSTRACT

A substrate wafer having components (13) is bonded onto a mount (3) and is thinned from the rear side. After producing a photoresist mask on the rear side of the substrate wafer, the latter is separated in an etching process into individual components (13). After removal of the photoresist mask, a further component (6), in particular a component stack, is applied onto at least one of the individual components (13) and is firmly connected to the individual component (13a).

8 Claims, 1 Drawing Sheet

METHOD FOR PRODUCING A THREE-DIMENSIONAL CIRCUIT ARRANGEMENT

BACKGROUND OF THE INVENTION

Three-dimensional circuit arrangements are implemented as a component stack for cubic integration. Individual components are stacked one above the other in a component stack, and are firmly connected to one another. In this case, the individual components in each case comprise integrated circuits, sensor-actuator arrangements and/or passive components. The individual components can in this case be produced using different technologies. The various components are electrically connected to one another, one above the other, by vertical contacts.

During the production of such a three-dimensional circuit arrangement, the components are first of all produced in a conventional manner in a substrate. There are then in principle two options for joining the component stack together. On the one hand, the components can all first of all be separated and then joined together to form the stack. As a rule, this is done such that a substrate which comprises a further component to be added to the stack is bonded by the front side onto a robust mount. The substrate is thinned to about 10 $\mu$m from the rear side. The substrate is then separated into the individual components. The separate component is then placed onto a component or a component stack. The fitted component is mechanically and electrically connected to the component or the component stack. The component stack formed in this way is detached from the mount and is connected to further components in an analogous manner.

On the other hand, the substrate, which comprises a component which is to be added to a stack, is not separated until after mechanical attachment. To this end, the substrate is bonded by the front side onto a mount and is thinned from the rear side. The component or the component stack is then placed upside-down onto the substrate and is mechanically and electrically connected to it. The separation into individual component stacks does not take place until then.

The separation of substrates into individual components is carried out in microelectronics by sawing. In the case of the first method, the sawing of the substrate is carried out immediately before the components are fitted. Contamination, which is produced during sawing of the substrate, must be removed from the surface of the components before mechanical connection.

If the components are mechanically connected to one another with the aid of an adhesive, then, as a rule, the adhesive is applied before separation. After cleaning contamination which has been produced during sawing, the surface of the adhesive must then be reactivated.

Furthermore, the mount must also be split during separation of the substrate. The material of the mount must therefore be selected such that it can be separated using the same saw as the thinned substrate wafer. Furthermore, in this case, the mount is destroyed when each component level is added.

In the case of the second method, the separation of the substrate is not carried out until after the mechanical connection to the component stack which is to be added to. The mount must likewise be split in this case when the substrate is split. The material for the mount must therefore likewise be matched to the substrate material. Since component stacks are in this case arranged on the substrate which are each composed of thinned layers and are highly susceptible to fracture, it is necessary to avoid the saw touching the edge of the stack. During each step, it is therefore necessary to maintain a minimum distance between the saw edge and the stack edge. In consequence, the space utilization on the substrate and thus the material utilization of the substrate and of the mount are limited. A new mount must also be used in this case for each component level to be added, since this mount is split up during separation.

SUMMARY OF THE INVENTION

The invention is based on the problem of specifying a further method for producing a three-dimensional circuit arrangement, in which fragmentation of thinned substrate wafers is avoided. In particular, it is intended to achieve better material utilization of the substrate and mount.

In general terms the present invention is a method for producing a three-dimensional circuit arrangement. A substrate wafer which has components in a first main surface is bonded by the first main surface via an adhesive layer to a mount. The substrate wafer is thinned from a second main surface which is opposite the first surface. A photoresist mask is produced on the second main surface. The substrate wafer is separated in an etching process into individual components which are connected to the mount. After removal of the photoresist mask, at least one further component is arranged on at least one of the individual components and is firmly connected thereto to form a component stack.

As the further component, a stacked is fitted which has at least two components which are stacked one above the other and which are firmly connected to one another.

The photoresist mask is produced by spin-on deposition of a photoresist layer, by exposure of the photoresist layer using lithography which is adjusted to the components, and by development of the photoresist layer.

The etching process for separating the substrate wafer is carried out by wet-chemical means.

The etching process for separating the substrate wafer is carried out by a plasma etching process.

The component stack is separated from the mount. The mount is UV-permeable. The adhesive layer is embrittled by UV radiation in order to detach the component stack from the mount. The mount is formed from quartz glass, and the adhesive layer is formed from fusion adhesive.

In the method according to the invention, a substrate wafer which comprises components in a first main surface is bonded by the first main surface onto a mount. The substrate wafer is thinned from a second main surface, which is opposite the first. A photoresist mask is then produced on the second main surface and is used as an etching mask in a subsequent etching process. The substrate wafer is separated into individual components in the etching process. The components are furthermore connected to the mount via the adhesive layer. The photoresist mask is produced such that it protects those areas of the substrate wafer in which components are arranged against etching attack. After removal of the photoresist mask, at least one further component is arranged on at least one of the individual components and is firmly connected to it to form a component stack. The further component can in this case itself be a component stack. Since the substrate wafer is split in an etching process, fragmentation of the substrate wafer, as occurs during sawing, is reliably avoided.

Since only the substrate wafer itself is split during separation of the substrate wafer in the method according to the invention, the material for the mount may be chosen as required. The complete component stack can then be separated by sawing of the mount.

According to another, particularly advantageous embodiment, the component stack is detached from the entire mount. The mount is not destroyed in this case, so that relatively expensive materials such as ceramics, for example, can also be used for the mount. In particular, it is within the scope of the invention to provide the mount from a UV-permeable material, for example quartz glass, and to embrittle, and thus to detach the adhesive layer by UV radiation through the mount, in order to detach the complete component stack from the mount. If the component stack is detached using a solvent, then this acts between adjacent component stacks via the cracks which are opened in the etching process.

The separation of substrate wafers, which comprise integrated circuits, in an anisotropic etching process has admittedly already been proposed in German reference DE 43 08 705 A1, in order to produce chips of any desired shape which cannot be implemented by a sawing method. The problem of fragmentation of thinned substrate wafers and of material consumption for cubic integration has not, however, been addressed there.

Since the substrate wafer thickness is preferably 5 $\mu$m to 20 $\mu$m after thinning, the etching process for separation of the substrate wafer can be carried out both by wet-chemical means and as a plasma etching process. During wet-chemical etching, lateral etching occurs in the order of magnitude of the substrate wafer thickness which is, for example, about 10 $\mu$m. The distance between adjacent components of the substrate wafer must be selected to be appropriately large in the case of wet-chemical etching. Normal distances between the components on a substrate wafer using silicon technology are 100 $\mu$m, so that the layer thickness of 10 $\mu$m does not represent a limitation in this regard. Increased cleanliness can be ensured in the case of a silicon wafer by using a plasma etching process to separate the substrate wafer. However, this increases the etching time.

It is within the scope of the invention to produce the photoresist mask by spin-on deposition of a photoresist layer onto the second main surface, exposure of the photoresist layer using lithography which is adjusted to the components, and development of the photoresist layer. The adjustment of the lithography can be carried out, in particular, onto the visible contact surfaces.

The connection between the components in the component stack can be produced both with the aid of adhesive, for example fusion adhesive or polyimide, as well as by soldering of metal surfaces which are applied to the boundary surfaces.

After the substrate wafer has been ground thin from the second main surface, further rear-side processes can first of all be carried out, such as opening of contact holes from the second main surface, for example, which contact holes extend to wiring planes of the components, and via which electrical contact is made between components which are adjacent in the stack.

The method can be applied particularly advantageously when using components which are implemented in semiconductor substrates since, in the case of semiconductor substrates, there is a particularly high risk of fragmentation during processing with separating saws.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

A substrate wafer 1 which is composed, for example, of monocrystalline silicon and comprises components in the region of a first main surface 11 is bonded onto a mount 3 with the aid of an adhesive layer 2. The components which surround the substrate wafer 1 in the region of the first main surface 11, and which are not illustrated in detail for the sake of clarity, comprise integrated circuits and/or sensor and actuator structures. The mount 3 is composed, for example, of quartz glass. Fusion adhesive is used, for example, as the adhesive layer 2.

Figure 1:
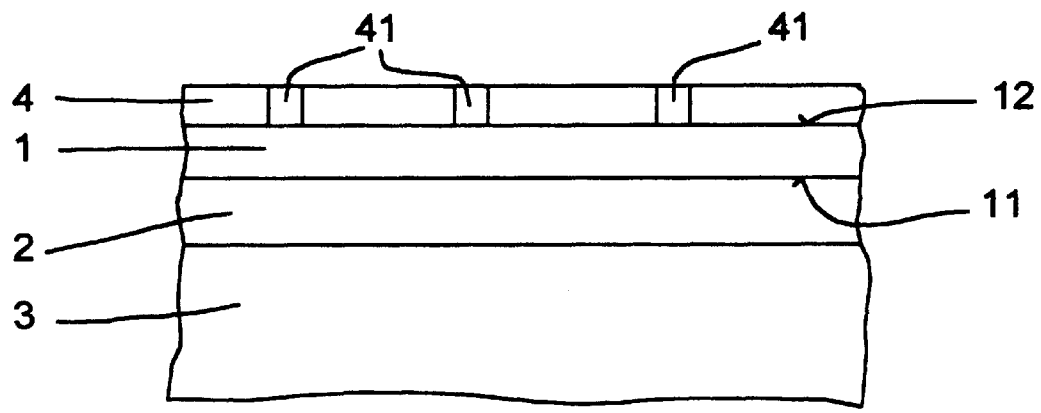
FIG. 1 shows a mount having a thinned substrate wafer and a photoresist mask.

The substrate wafer 1 is thinned, for example by being ground thin, from a second main surface 12 which is opposite the first main surface 11. After thinning, the substrate wafer 1 has a thickness of 5 to 20 $\mu$m, preferably 10 $\mu$m, at right angles to the first main surface 11. A photoresist mask 4 is subsequently applied onto the second main surface 12 (see FIG. 1).

The photoresist mask 4 is preferably produced by spin-on deposition of a photoresist layer onto the second main surface 12 of the substrate wafer 1, exposure of the photoresist layer using lithography which is adjusted to the components, and development of the photoresist layer. The photoresist mask 4 covers those areas of the second main surface 12 of the substrate wafer 1 under which components are arranged. The photoresist mask 4 has openings 41 in the substrate wafer 1, between adjacent components.

Figure 2:
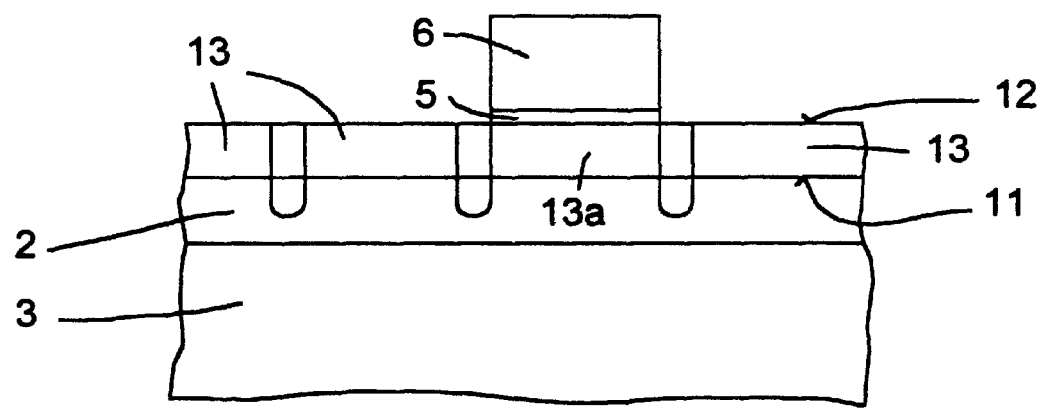
FIG. 2 shows the substrate wafer after separation into individual components and after fitting a component stack.

The substrate wafer 1 is now split into individual components 13 in an etching process, for example wet-chemically using etching solutions on a chromate/hydrochloric acid base according to Secco or Schimmel (see FIG. 2). Alternatively, a plasma etching process is used as the etching process. Reactive ion etching (RIE) with chlorine gas is particularly suitable, since this is optimized with respect to impurities and etching duration.

The substrate wafer 1 is cut through completely in the etching process, and the etching process is not interrupted until at least the surface of the adhesive layer 2 is exposed.

After removal of the photoresist mask 4, an adhesion layer 5 is applied to at least one component 13a of the components 13, and a further component 6 is fitted onto this adhesion layer 5. The further component 6 is firmly connected via the adhesion layer 5 to the first-mentioned component 13a. A polyimide layer is suitable, for example, as the adhesion layer 5, or a solder metal layer which forms a permanent mechanical connection via metal surfaces, which are applied on the boundary surfaces of the components 13a and 6, in a soldering step.

The further component 6, as a component stack, may comprise a plurality of components which are mechanically and electrically connected to one another. The component stack, which is formed from the component 13a and a further component 6, is firmly connected to the mount 3, as before, via the adhesive layer 2. The component stack 13a, 6 is removed from the mount 3 by detaching the adhesive layer 2.

The adhesive layer 2 is preferably detached by irradiation with UV light on the rear side, during which the adhesive layer 2 is embrittled. To do this, it is necessary for the mount 3 to be UV-permeable.

Alternatively, the adhesive layer 2 is dissolved with the aid of a solvent, preferably acetone.

In the practical implementation of the method according to the invention, it is advantageous to apply an adhesion layer 5, on which components or a component stack 6 are arranged, simultaneously onto all the functional components 13. After the mechanical connection of the component stacks which are produced in this way, these stacks are simultaneously removed from the mount 3 by detaching the adhesive layer 2, for example by UV radiation.

The mount 3 is not damaged in the method according to the invention and it is possible to continue using it for fitting further component levels onto the component stack.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for producing a three-dimensional circuit arrangement, comprising the steps of:

providing a substrate wafer having components in a first main surface thereof, the substrate wafer also having a second main surface opposite the first main circuit;

bonding the first main surface via an adhesive layer to a mount;

thinning the substrate wafer from the second main surface;

producing a photoresist mask on the second main surface;

separating the substrate wafer in an etching process into individual components which are connected to the mount; and arranging, after removal of the photoresist mask, at least one further component on at least one of the individual components and firmly connecting the at least one further component to the at least one of the individual components to form a component stack.

2. The method as claimed in claim 1, wherein the further component is a stack having at least two components which are stacked one above the other and firmly connected to one another.

3. The method as claimed in claim 1, wherein the method further comprises producing the photoresist mask by spin-on deposition of a photoresist layer, exposure of the photoresist layer using lithography which is adjusted to the components, and development of the photoresist layer.

4. The method as claimed in claim 1, wherein the etching process for separating the substrate wafer is carried out by a wet-chemical process.

5. The method as claimed in claim 1, wherein the etching process for separating the substrate wafer is carried out by a plasma etching process.

6. The method as claimed in claim 1, wherein the method further comprises separating the component stack from the mount.

7. The method according to claim 6, wherein the mount is UV-permeable, and wherein the method further comprises embrittling the adhesive layer by UV radiation in order to detach the component stack from the mount.

8. The method according to claim 7, wherein the mount is formed from quartz glass, and the adhesive layer is formed from fusion adhesive.

\* \* \* \* \*